United States Patent [19]

Vogt et al.

[11] Patent Number: 5,339,455

[45] Date of Patent: Aug. 16, 1994

[54] RADIO RECEIVER ADJACENT-CHANNEL INTERFERENCE SUPPRESSION CIRCUIT

[75] Inventors: Lothar Vogt, Hohenhameln; Stefan Bartels, Hildesheim; Rainer Arnold, Sibbesse; Detlef Schwarz, Hanover, all of Fed. Rep. of Germany

[73] Assignee: Blaupunkt Werke GmbH, Hildesheim, Fed. Rep. of Germany

[21] Appl. No.: 21,029

[22] Filed: Feb. 23, 1993

[30] Foreign Application Priority Data

Mar. 18, 1992 [DE] Fed. Rep. of Germany ....... 4208605

[51] Int. Cl.$^5$ .............................................. H04B 1/10
[52] U.S. Cl. .................................... 455/266; 455/297; 455/307
[58] Field of Search ............... 455/307, 295, 296, 302, 455/285, 266, 303, 306, 254; 333/17.1, 17.2, 173, 174

[56] References Cited

U.S. PATENT DOCUMENTS

| 3,889,108 | 6/1975 | Cantrell | 333/17.1 |
| 3,921,077 | 11/1975 | Suzuki | 455/307 |
| 3,953,802 | 4/1976 | Morris . | |
| 4,359,693 | 11/1982 | Sauer | 329/101 |
| 4,761,829 | 8/1988 | Lynk, Jr. et al. | 455/307 |
| 4,862,513 | 8/1989 | Brägas et al. | 455/45 |
| 4,868,881 | 9/1989 | Zwicker et al. | 381/107 |
| 4,907,293 | 3/1990 | Ueno | 455/295 |
| 5,220,687 | 6/1993 | Ichikawa | 455/266 |

FOREIGN PATENT DOCUMENTS

| 3289723 | 12/1991 | Japan | 455/266 |
| 2222332 | 2/1990 | United Kingdom | 455/303 |

Primary Examiner—Reinhard J. Eisenzopf
Assistant Examiner—Mark D. Wisler
Attorney, Agent, or Firm—Frishauf, Holtz, Goodman & Woodward

[57] ABSTRACT

A mobile radio receiver, for example, a car radio, needs a circuit to detect and suppress adjacent-channel interference. This can be done by using bandpass filters (14) of differing bandwidth. The present invention dynamically adjusts bandwidth to an optimum value by continuously comparing (13) a first signal level, upstream of the bandpass filter, to a second signal level, downstream of the bandpass filter, to derive a difference value representative of adjacent-channel interference, then uses an electronically controlled selector switch (6) to select a particular filter ($14_N$) whose bandwidth is sufficiently narrow to cut out the interfering broadcast signal. A table associating each magnitude range of interference with a particular filter bandwidth assures that bandwidth is broadened as interference diminishes, thereby assuring sufficient reception signal strength.

4 Claims, 1 Drawing Sheet

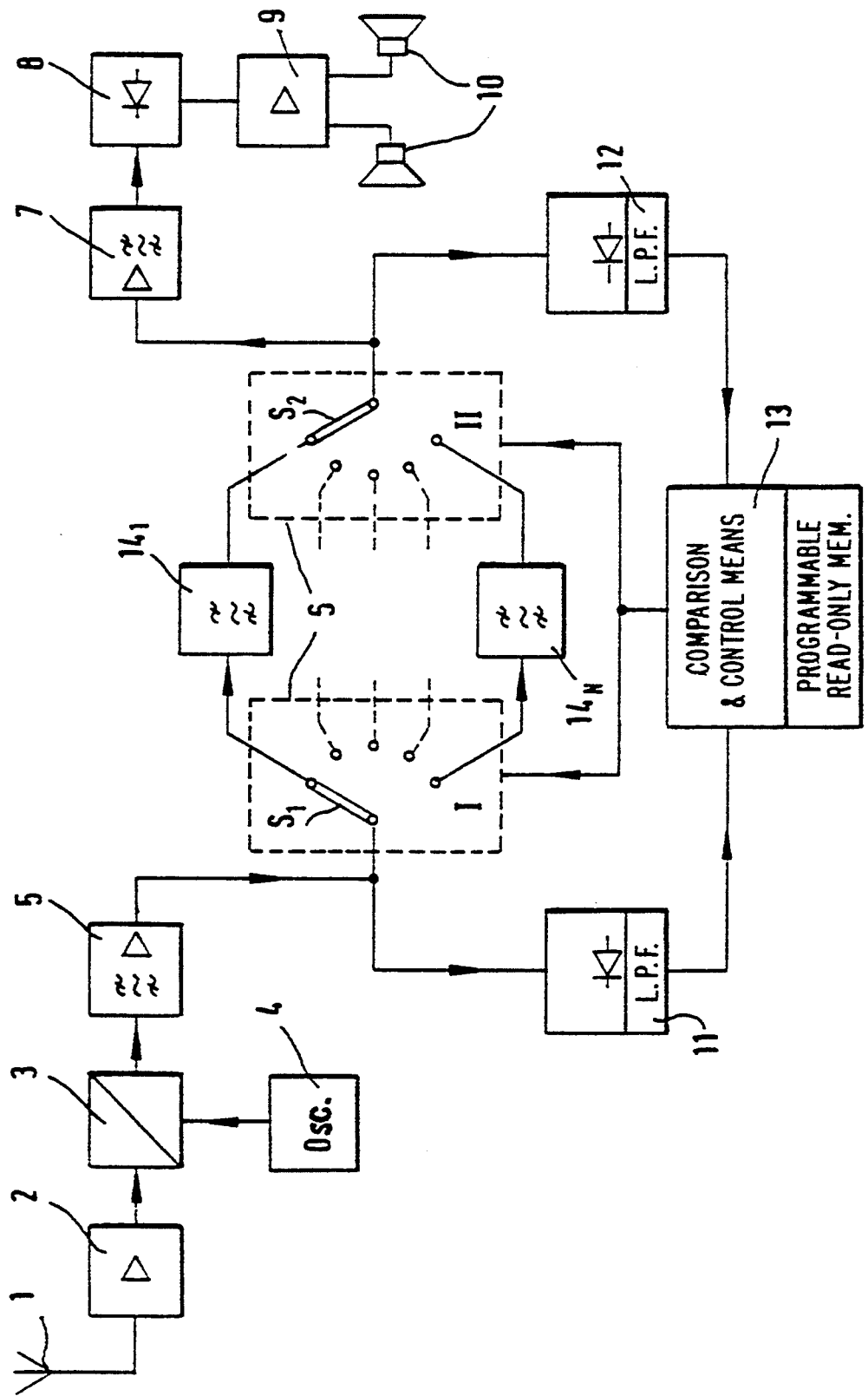

RADIO RECEIVER ADJACENT-CHANNEL INTERFERENCE SUPPRESSION CIRCUIT

CROSS-REFERENCE TO RELATED PATENTS AND APPLICATIONS, THE DISCLOSURES OF WHICH ARE INCORPORATED BY REFERENCE

U.S. Pat. No. 4,862,513, BRAGAS, issued Aug. 29, 1989, entitled RADIO RECEIVER WITH TWO DIFFERENT TRAFFIC INFORMATION DECODERS;

U.S. Pat. No. 4,868,881, ZWICKER et al., issued Sep. 19, 1989, entitled METHOD & SYSTEM OF BACKGROUND NOISE SUPPRESSION IN AN AUDIO CIRCUIT, PARTICULARLY FOR CAR RADIOS.

FIELD OF THE INVENTION

The present invention relates generally to a radio receiver circuit for detection and suppression of adjacent-channel interference, and, more particularly, to such a circuit which dynamically adapts receiver filter bandwidth to the instantaneous amount of the adjacent-channel interference.

BACKGROUND

Such circuits serve for suppression of interference caused when two transmitters broadcast on adjacent frequency channels, and one of the transmitters overmodulates its transmission, so that its signal oversteps the boundaries of its channel. This degrades the reproduction quality of the signal received from the other, "stepped-on" transmitter. Atmospheric conditions and reflections from moving objects may also contribute to adjacent-channel interference.

It is conventional, especially in AM receivers, to regulate or vary the Intermediate Frequency (IF) bandwidth as a function of the signal strength received from the adjacent channel transmitter. When the adjacent, potentially interfering transmitter is strong, one narrows the bandwidth of the circuit tuned to receive the desired transmitter, in order to avoid picking up any of the interfering adjacent-channel signal. To do this, one provides two receiving circuits, each tuned to one of the two adjacent channels. Each receiving circuit feeds a respective rectifier. The rectifier output voltages are then used in the IF stage of the receiver to adjust the IF bandwidth tuning or filtering. The bandwidth regulation is thus accomplished by damping or coupling or specifying in the IF resonant or tuned circuit.

THE INVENTION

It is an object of the present invention to provide a circuit for an FM radio receiver for detection and suppression of adjacent channel interference, and thus for trouble-free reception of a transmitter subject to adjacent channel interference.

Briefly, the circuit of the present invention includes an array of N different bandpass filters, arranged in parallel, and a control circuit which interposes, in the IF signal path, an appropriate one of the filters, depending upon the current magnitude of adjacent-channel interference, as measured by comparing the signal strength at the input of the bandpass filter with the signal strength at the output of the bandpass.

A significant advantage of this structure is that it is requires relatively few additional components, yet reliably detects and suppresses adjacent-channel interference and other reception disturbances, such as multipath reception and ignition noise. It avoids erroneous choices. It does not interfere with reception of traffic bulletins, Radio Data System (RDS) signals, or stereo signals. Unlike conventional circuits for noise sampling, in which the noise detection occurs downstream of the FM demodulator, the present invention does not impair receiver performance or functioning.

Preferably, the signal strengths at the input and output of the bandpass filter are measured using conventional rectifier/filter combinations. The use of predetermined interference magnitudes to specify particular bandwidth filters provides highly flexible adjustment, to maintain signal strength. The stepwise dynamic adjustment of filter bandwidth substantially avoids discontinuities in the reproduced signal.

DRAWING

The single figure is a schematic block diagram of the interference suppression circuit of the present invention.

DETAILED DESCRIPTION

The output signal from an antenna 1 is fed to a high-frequency stage 2, whose output signal in turn is fed to a mixer 3, which is also supplied with the output signal from an oscillator 4. The output signal from mixer 3 is fed to a preamplifying and filtering IF stage 5. The output of IF filter 5 is connected to the first wiper or selector $S_1$ of an electronically controlled multiple-deck switch 6 which has two switching decks or pies I and II. Deck I is an input deck of the switch, while deck II is an output deck, and connected between the decks are a plurality of IF filters $14_1$ through $14_N$. The second wiper or selector $S_2$, on deck II of switch 6, is connected to the input of an IF amplifier 7. Downstream of IF amplifier 7 are connected, in series, an FM demodulator 8, an audio frequency amplifier 9, and at least one speaker 10. Although one may also provide a stereo demodulator, a traffic bulletin decoder, and a Radio Data System (RDS) decoder, these are fully described in other patents of the present assignee, and are therefore omitted here, in order to simplify illustration. See, for example, U.S. Pat. No. 4,862,513. Those skilled in the art can connect such additional elements at the appropriate points in the circuit.

The first selector $S_1$ is also connected to the input of a first level evaluation or threshold circuit 11, and the second selector $S_2$ is also connected to the input of a second level evaluation or threshold circuit 12. The respective outputs of circuits 11 and 12 are connected to the inputs of a comparison circuit 13. The output signal from circuit 13 synchronously controls selectors $S_1$ and $S_2$ of switch 6, i.e. the selectors move together so that in position 1, they connect respectively to the input and output terminals of filter $14_1$; in position 2, they connect to filter $14_2$, etc. The IF filters $14_1$ through $14_N$ have stepped respective bandwidths, i.e. filter $14_1$ passes the widest bandwidth of all the filters, filter $14_2$ passes a narrower band than does $14_1$, filter $14_3$ passes a narrower band than does $14_2$, and so forth. Filter $14_1$ is dimensioned such that the bandwidth in the IF signal path is less at wiper $S_2$ than it is at wiper $S_1$ upstream, and that the IF bandwidth of the complete signal path corresponds to that required for the unimpeded reception of a standard FM transmitter signal.

The signal levels which are present at the wipers $S_1$, $S_2$ are detected by respective level evaluation circuits 11 and 12, using, for example, respective rectifiers and low-pass filters, and these levels are fed to the comparison circuit 13.

Upon reception of a transmission with no adjacent-channel interference, the levels at the input and output of filter $14_1$, i.e. at $S_1$ and $S_2$, are approximately the same. Therefore, filter $14_1$ remains connected. However, as soon as adjacent-channel interference creeps into the frequency band specified by the IF signal path, the signal level or amplitude climbs at first selector $S_1$ more sharply than at second selector $S_2$. This is because the signal at the input of bandpass filter 14 represents a larger portion of the radio spectrum than the signal at the output of bandpass filter 14, and, when there is a signal in the adjacent channel, this contributes to signal strength. These two signal levels are compared in circuit 13 to derive a difference value, representative of interference. Circuit 13 is preferably a logic circuit, e.g. a microprocessor.

Circuit 13 includes a table associating N ranges of difference values with a respective one of the N filters. This table can be stored in a PROM (Programmable Read-Only Memory). If the signal level present at first wiper $S_1$ exceeds the signal level at wiper $S_2$ by a difference value which falls in the predetermined Nth range, circuit 13 controls switch 6 to perform a switchover to filter $14_N$. Thus, at specific predetermined thresholds, a switchover to a predetermined corresponding bandwidth is performed. If the adjacent-channel interference worsens, the bandwidth is narrowed again; if the interference diminishes, the bandwidth is broadened.

Thus, there is a dynamic adaptation to current reception conditions. The bandwidth is kept as broad as possible, since there may be a signal-strength penalty associated with narrow bandwidth, yet bandwidth is narrowed as much as necessary to exclude the adjacent-channel interference.

In this way, it is possible to achieve satisfactory reception quality, even when adjacent-channel interference would otherwise render the signal of a particular transmitter unusable. This is particularly advantageous for the fluctuating reception conditions in which vehicle radios must operate.

Various changes and modifications are possible within the scope of the inventive concept. For example, instead of the array of parallel filters of differing bandwidth, as shown, one could employ a set of filters in series, and use switches to select which ones form part of the signal path at any given time.

Suitable signal level evaluation circuits 11, 12 are model no. TDA1596 made or sold by the firm Philips.

A suitable comparison circuit 13 is model LM2902, TCA965 made or sold by the firm NS, Siemens.

A preferred range of IF filter bandwidths is from 120 kHz for the broadest filter $14_1$ to 50 kHz for the narrowest filter $14_N$.

What is claimed is:

1. An adjacent-channel interference detection and suppression circuit for a mobile radio receiver comprising a plurality of circuit elements (5, 6 7) defining an intermediate frequency signal path in said receiver;

means ($14_1$–$14_N$) for adjusting frequency bandwidth in said signal path, including a plurality of filters of differing respective bandwidths, and switching means interposing at least one of said filters in said signal path;

first means (11) for measuring a first signal level, at an input of said at least one filter;

second means (11) for measuring a second signal level, at an output of said at least one filter; and comparison and control means (13), having a pair of inputs, connected to respective outputs of said first and second measuring means, subtracting said second signal level from said first signal level to determine a difference value and, on the basis of said difference value, generating an output control signal which causes said switching means (6) to interpose, in said signal path, one of said filters (14) whose bandwidth is sufficiently narrow to substantially prevent adjacent-channel interference.

2. A circuit according to claim 1, wherein said comparison and control means is responsive to at least one threshold value, by which said first signal level exceeds said second signal level, to cause adjustment of the intermediate frequency signal path bandwidth to a bandwidth predefined as corresponding to said threshold value.

3. A circuit according to claim 1, wherein said plurality of filters ($14_1$–$14_N$) are connected in parallel to each other, and have progressively narrower bandwidths, and said comparison and control means (13) directs said switching means (6) to interpose a narrower filter whenever interference increases, and to interpose a wider filter whenever interference decreases.

4. A circuit according to claim 1, wherein said comparison and control means (13) is a logic circuit.

* * * * *